United States Patent
Jensen et al.

(10) Patent No.: US 6,466,147 B1
(45) Date of Patent: Oct. 15, 2002

(54) METHOD AND APPARATUS FOR RANDOMIZED DYNAMIC ELEMENT MATCHING DAC

(75) Inventors: Henrik T. Jensen, Los Angeles; Joseph F. Jensen, Malibu, both of CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/427,195

(22) Filed: Oct. 25, 1999

(51) Int. Cl.$^7$ ............................................ H03M 1/66
(52) U.S. Cl. ............................................ 341/144; 341/143
(58) Field of Search ............................ 341/144, 148, 341/154, 143, 150, 139, 141, 145, 50, 61, 122

(56) References Cited

U.S. PATENT DOCUMENTS

| | | |
|---|---|---|
| 4,030,092 A | 6/1977 | Sieber et al. |
| 4,935,741 A | 6/1990 | Reich |
| 4,994,803 A | 2/1991 | Blackham |
| 5,084,701 A | 1/1992 | Sauerwald |
| 5,305,004 A | 4/1994 | Fattaruso |
| 5,404,142 A | 4/1995 | Adams et al. |
| 5,684,482 A * | 11/1997 | Galton ............... 341/144 |
| 5,684,492 A | 11/1997 | Galton |
| 5,703,587 A * | 12/1997 | Clark et al. ......... 341/144 |
| 5,760,726 A | 6/1998 | Koirman et al. |
| 5,818,377 A | 10/1998 | Wieser |
| 5,821,892 A | 10/1998 | Smith |
| 6,028,544 A * | 2/2000 | Zarubinsky et al. ... 341/143 |
| 6,154,161 A * | 11/2000 | Leme et al. ......... 341/143 |
| 6,201,490 B1 * | 3/2001 | Kawano et al. ...... 341/139 |
| 6,232,903 B1 * | 5/2001 | Koifman et al. ..... 341/144 |

OTHER PUBLICATIONS

I. Galton, "Spectral Shaping of Circuit Errors in Digutal–to–Analog Converters", IEEE Transactions on Circuits and Systems, Part 2: Analog and Digital Signal Processing, vol. 44, No. 10, pp. 808–817, Oct. 1997.

L. R. Carley, "A Noise Shaping Coder Topology for 15+ bit Converters", IEEE Journal of Solid State Circuits, vol. SC–24, pp. 267–273, Apr. 1989.

* cited by examiner

Primary Examiner—Peguy Jeanpierre
Assistant Examiner—Joseph Lauture
(74) Attorney, Agent, or Firm—Tope-McKay & Assoc.

(57) ABSTRACT

A method and apparatus for digital-to-analog conversion utilizing randomized dynamic element matching for the attenuation of harmonic distortion during the conversion process due to non-ideal circuit behavior is presented. The present invention introduces a new DEM approach that results in a simplified DAC architecture relative to previous DACs, while preserving optimal spurious-free dynamic range (SFDR). The particular topology utilized involves the use of a bank of DAC-elements, preferably 1-bit DAC elements, the outputs of which are summed to yield a single multiple-level DAC. During each conversion cycle, random selection is used to determine the addresses of the DAC-elements used in order to "scramble" the DAC noise arising from each individual 1-bit DAC.

13 Claims, 5 Drawing Sheets

METHOD AND APPARATUS FOR RANDOMIZED DYNAMIC ELEMENT MATCHING DAC

TECHNICAL FIELD

The present invention is related to the field of solid-state electronic circuits, and more particularly to the field of digital-to-analog converters employing randomized dynamic element matching techniques.

BACKGROUND OF THE INVENTION

Digital-to-analog converters (DACs) operate to convert signals representing values in the digital domain to the same values represented in the analog domain, and are therefore ideally linear devices. However, the non-ideal circuit behavior of practical DACs introduces non-linearities that cause harmonic distortion and limit the achievable spurious-free dynamic range (SFDR).

The continued growth in wireless technology has spawned an increased demand for large-scale integration digital-to-analog conversion techniques. For example, a technique frequently used in wireless communication products is direct digital synthesis (DDS). In DDS, analog signals, such as carrier tones, are synthesized using mostly digital circuitry. The front-end digital-to-analog converter (DAC) used to convert the input digital signal into an analog waveform limits the efficiency in many DDS systems. In particular, the production of harmonic distortion during the conversion places an upper boundary on the SFDR of the entire system.

In order to attenuate or eliminate harmonic distortion resulting from non-ideal circuit behavior in various multi-bit DACs, dynamic element matching (DEM) techniques have been successfully applied. Rather than using special fabrication processes or laser trimmed components to improve performance, non-ideal circuit behavior is accepted as inevitable, and signal-processing techniques are applied to mitigate the negative effects on DAC linearity.

An example of a popular multi-bit DAC architecture involves the use of a plurality of nominally identical current sources whose outputs are summed to yield a composite DAC. During monolithic integration of high-accuracy current sources for volume production of solid-state circuits, however, the problem arises that, due to current source manufacturing variations, individual current sources vary in the current they deliver. These current source manufacturing variations can largely be compensated for by the use of a current divider and by switching the currents of a plurality of current sources to three current paths in a "rotating" manner by means of a cyclic shift register, with the first and second current paths being fed half the current of the third path. By cascading a plurality of such current dividers, a high-accuracy monolithic integrated DAC can be implemented. The binary signal is caused to "rotate" by means of a cyclic shift register, and the "rotating" signal drives a set of switches to turn the individual current sources on or off In order to utilize this "rotation" method, the frequency of the shift signal for the shift register must be at least $(2^n-1)$ times higher than the frequency of the sampling signal at whose pulse repetition rate the binary signals occur. However, use of such a shift signal is not always feasible, e.g. an oscillator operational at a correspondingly stable frequency is too expensive for a specific application. In addition, the frequency of the shift signal often lies in ranges that necessitate particularly careful design of, and specific manufacturing processes for, the integrated circuit.

Another approach applied in monolithic integration involves the input signal being applied to a conventional DAC, and first. processed so that its value is uncorrelated with that of the unprocessed input signal. Adding a digital random number to the input digital signal can effect this processing. The digital random number is then converted into analog form by a second DAC. An analog subtraction circuit then subtracts the analog version of the processed sum. The difference is the analog counterpart to the original digital input signal.

The present invention proposes the use of a new DEM technique suitable for applications requiring low-distortion DACs, such as DDS. It is demonstrated that harmonic distortion is eliminated, i.e., the DAC noise is white, and thus an optimal SFDR is achieved. These results are achieved by utilizing a topology that incorporates a bank of, preferably 1-bit, DACs, the outputs of which are summed together to yield a single multi-bit DAC. The DAC noise arising from mismatches between the individual 1-bit DACs is "scrambled" by randomly selecting one of the appropriate codes for each digital input value. A digital encoder is exploited to carry out the scrambling process, the ultimate effect being modulation of the DAC noise without modulation of the signal component of the DAC output.

SUMMARY OF THE PRESENT INVENTION

A digital-to-analog converter used in converting digital input signals to analog output signals using a bank of, preferably 1-bit, DACs, or "unit DAC elements" (UDEs) as follows. A multi-bit digital signal is received by an encoder, which translates the received signal into multiple one-bit binary signals. Each binary signal is received by a UDE that converts the binary signal to analog. The encoder implements a randomization algorithm that identifies the UDEs to be selected during each conversion cycle. The UDE analog output paths are connected through a summing node to generate the final analog output corresponding to the original digital input signal.

BRIEF DESCRIPTION OF THE DRAWINGS

FIG. 3 provides a demonstration of the simulated power spectral density (PSD) relative to $N^2$ of a particular signal of the digital-to-analog converter (DAC) operating with a 3-bit dithered sinusoidal input, wherein:

DETAILED DESCRIPTION

The present invention relates to a digital-to-analog conversion method employing randomized element shuffling and apparatus incorporating it therein, and may be tailored to a variety of applications. The following description is presented to enable one of ordinary skill in the art to make and use the invention and to incorporate it in the context of particular applications. Various modifications, as well as a variety of uses indifferent applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

Figure 1:
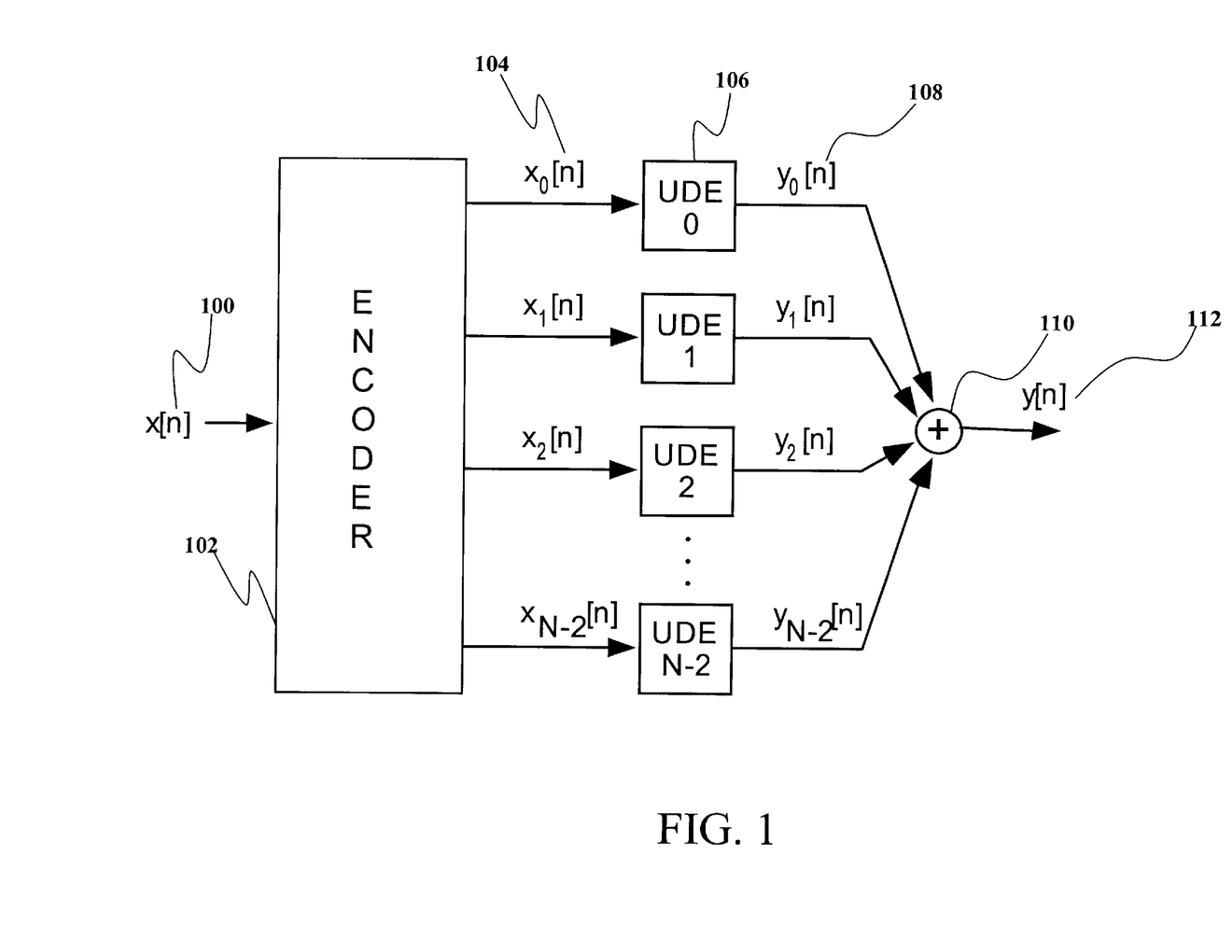
FIG. 1 demonstrates the topology of an N-level version of the proposed digital-to-analog converter (DAC)

An example of a generic N-level DAC topology of the present invention is shown in FIG. 1, wherein a N-level digital input signal x[n] is provided. The particular nature of the N-level digital input signal x[n] may vary from application to application and may, for example, represent an audio signal. The N-level digital input signal x[n] 100 is applied to an encoder 102, preferably a stochastic barrel shifting encoder (SBSE). The encoder 102 coverts the N-level digital input signal x[n] 100 into N−2 one-base unit codes 104 (e.g. bits in the case of binary codes) that are fed into the N−2 DACs. FIG. 1 specifically demonstrates the case of a binary N-level digital input signal x[n] 100, where the DAC elements are preferably Unit DAC elements (UDEs) 106. Although the binary case is shown in FIG. 1, it is important to note that other digital-to-analog converter types may be used depending on the numerical base of the input signal. The fragmented analog signal output 108 is processed into an analog output summing node 110, resulting in the final analog output 112.

The N-level digital input signal x[n] 100, is in the form of a sequence of unsigned integers such that x[n]<N. As shown in FIG. 1 by the lines emerging from the encoder 102, each input sample is mapped onto N−2 output bits, $x_0[n] \ldots x_{N-2}[n]$ 104, such that $$\sum_{i=0}^{N-2} x_i[n] = x[n].$$

Each UDE 106 operates according to $$y_r[n] = \begin{cases} 1+e_{h_r}, & x_r[n]=1; \\ e_{l_r} & x_r[n]=0; \end{cases}$$

where $y_r[n]$ denotes the analog output of the $r^{th}$ UDE 106, and $e_{h_r}$ and $e_{l_r}$ are errors in the analog output levels. The errors are assumed to be time-invariant, but otherwise arbitrary, and are referred to as static mismatch errors. The $r^{th}$ UDE 106 is selected whenever $x_r[n]=1$.

With non-zero static mismatch errors, the output y[n] of the multi-bit DAC can be written in the form:

$$y[n]=\alpha x[n]+\beta+e[n],$$

where α is a constant gain, β is a DC offset, and e[n] is zero-mean DAC noise. The purpose of the encoder 102 is to dynamically select the UDEs 106 such that e[n] is white and uncorrelated with the input. To accomplish this purpose, the present invention utilizes a method that processes a random offset integer, provided by a random number generator, to select the appropriate UDEs 106 during each conversion cycle. For purposes of FIG. 1, the random number generator is assumed to be contained within the encoder 102, though depending on the specific embodiment this may or may not be the case. The encoder 102 associates the x[n] elements 104 with UDEs 106 (which may take the more general form of digital-to-analog converter elements (DACE)) as follows, $$UDE_{o[n]}, UDE_{(o[n]+1)\%(N-1)}, \ldots, UDE_{(o[n]+x[n]-1)\%(N-1)},$$

where % denotes the "modulo" operator and o[n] is a random integer offset from the set $\{0, 1, \ldots, N-2\}$. It is important that possible values of o[n] are equi-probable, i.e., $$P\{o[n] = i\} = \frac{1}{N-2}$$

for all i, and the value of o[n] is statistically independent, or approximately statistically independent, of previous values. As shown in FIG. 1, the number of UDEs 106 utilized for a particular input signal x[n] 100 of N-levels is N−1, addressed $\{0, 1, \ldots, N-2\}$. A series of UDEs 106, beginning with an address $\{0, 1, \ldots, N-2\}$ are used to perform the digital-to-analog conversion. Because the UDEs 106 are non-ideal, each generates a particular output error pattern. Randomizing the sequence of UDEs 106 by randomly selecting the address of the first UDE 106 causes the particular output error pattern of each individual UDE 106 to be averaged with the particular output error pattern of the other individual UDEs 106 in order to produce a random, white noise error pattern rather than an error pattern of spurs as results from the individual UDEs 106.

Figure 2:
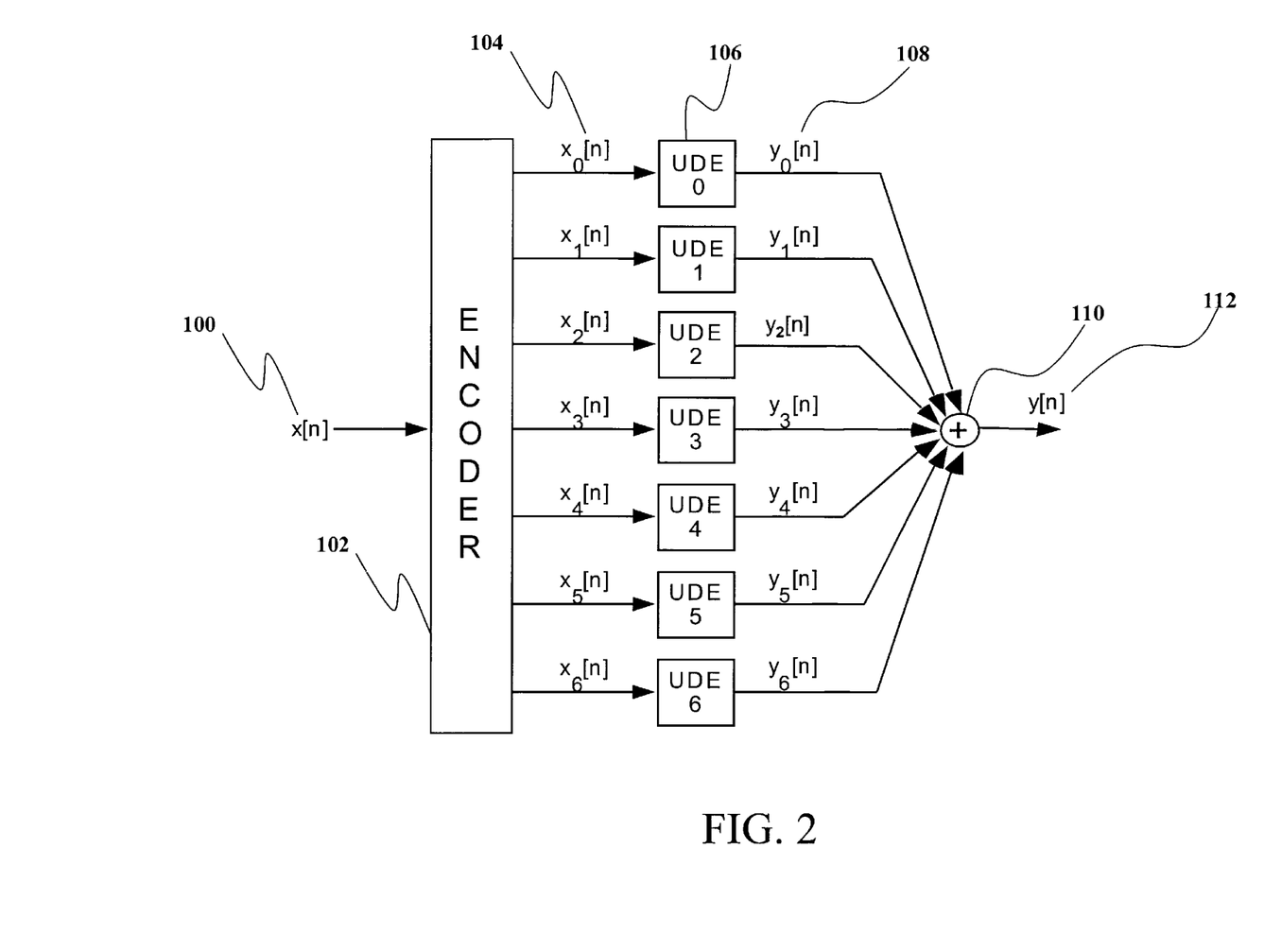
FIG. 2 demonstrates the topology of an 8-level, 3-bit version of the proposed digital-to-analog converter (DAC)

The block diagram in FIG. 2 demonstrates the use of the randomized dynamic element matching technique of the present invention for an 8-level DAC embodiment, i.e., $x[n] \in \{0, 1, \ldots, 7\}$. Thus, a total of the number of UDEs necessary is N−1=7, addressed $\{0, 1, \ldots, 6\}$.

Figure 3A:
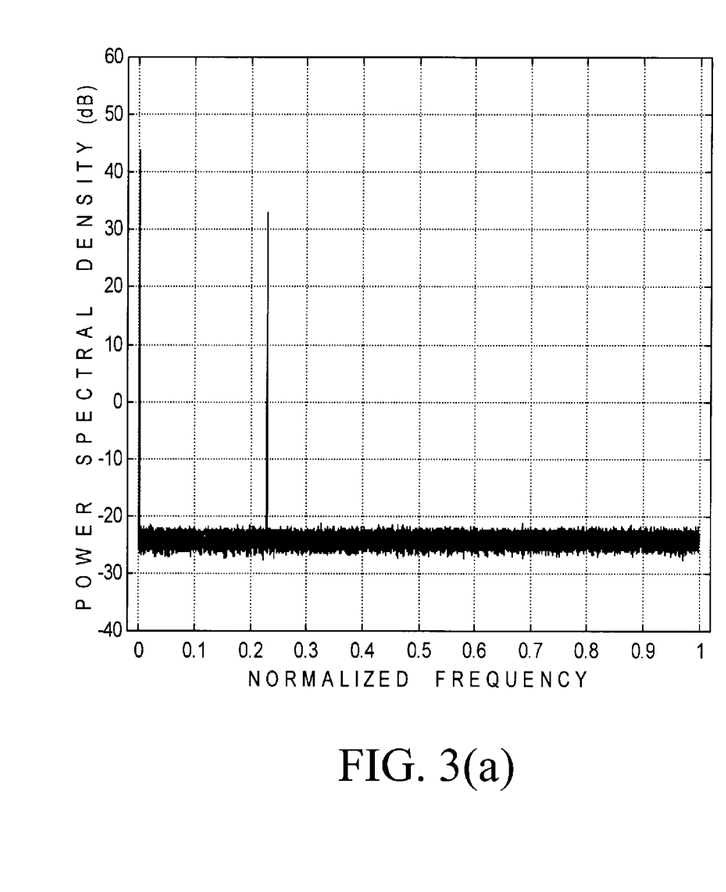
FIG. 3(a) provides the output y[n] of an ideal digital-to-analog converter (DAC) with no static mismatch errors.
Figure 3B:
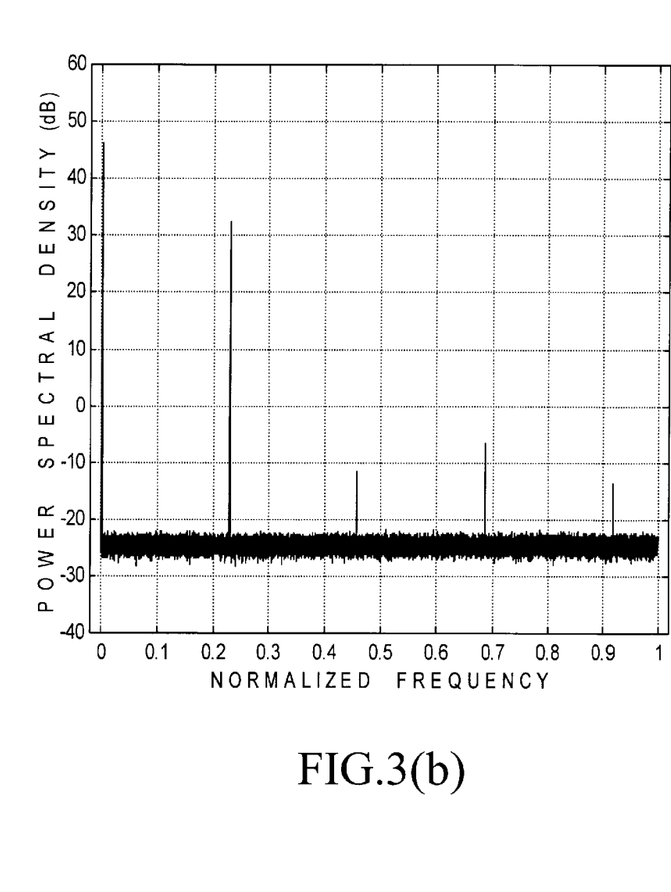
FIG. 3(b) provides the output y[n] of a non-ideal digital-to-analog converter (DAC) without dynamic element matching.
Figure 3C:
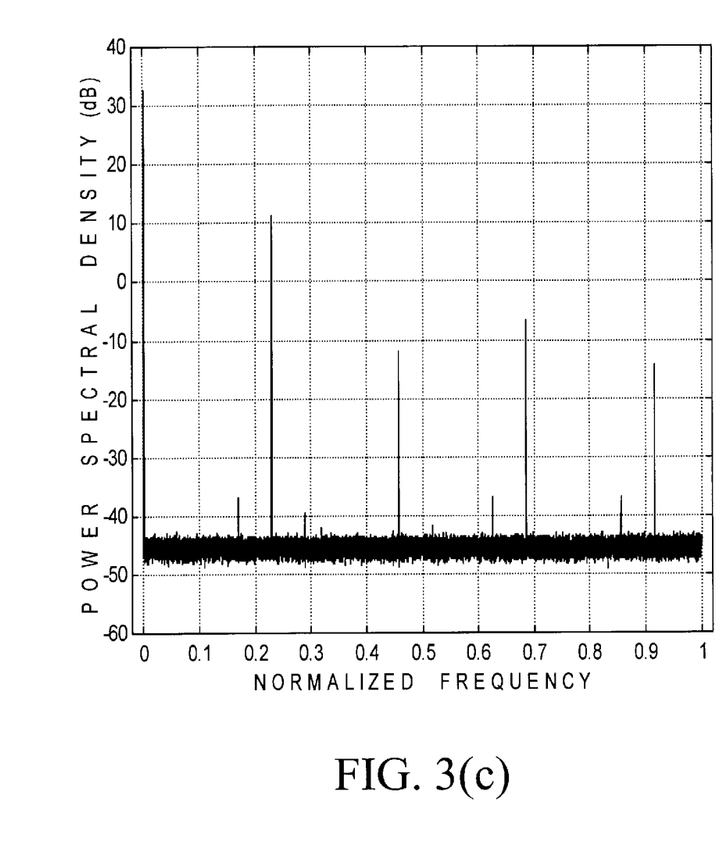
FIG. 3(c) provides the difference between the input and output signals y[n]–x[n] of a non-ideal digital-to-analog converter (DAC) without dynamic element matching.
Figure 3D:
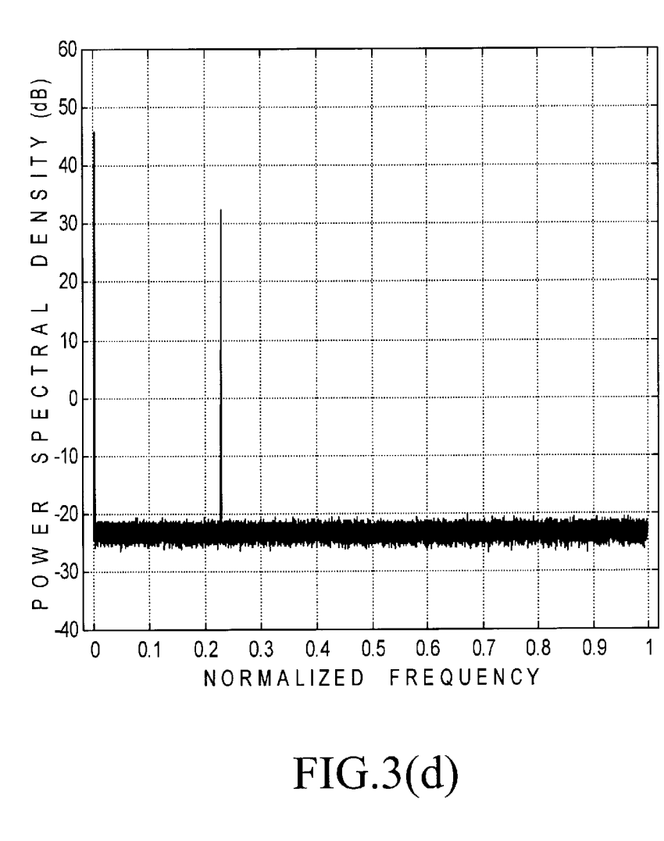
FIG. 3(d) provides the output y[n] of a non-ideal digital-to-analog converter (DAC) using the dynamic element matching provided by the present invention.
Figure 3E:
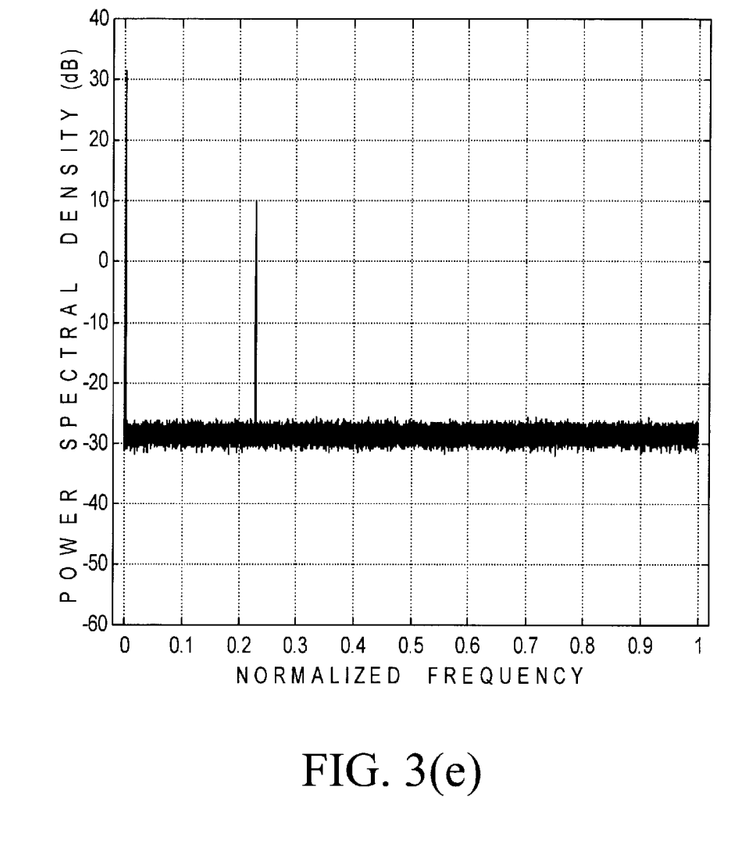
FIG. 3(e) provides the difference between the input and output signals y[n]–x[n] of a non-ideal digital-to-analog converter (DAC) using the dynamic element matching provided by the present invention.

The simulated performance of the example DAC is presented in graphical form in FIG. 3. Each portion of the figure shows the simulated power spectral density (PSD) relative to $N^2$ of a particular signal of the DAC operating with a 3-bit, 8-level dithered sinusoidal input. More specifically, FIG. 3(a) provides the output y[n] of an ideal digital-to-analog converter (DAC) with no static mismatch errors. FIG. 3(b) provides the output y[n] of a non-ideal digital-to-analog converter (DAC) without dynamic element matching. FIG. 3(c) provides the difference between the input and output signals y[n]−x[n] of a non-ideal digital-to-analog converter (DAC) without dynamic element matching. FIG. 3(d) provides the output y[n] of a non-ideal digital-to-analog converter (DAC) using the dynamic element matching provided by the present invention. FIG. 3(e) provides the difference between the input and output signals y[n]-x[n] of a non-ideal digital-to-analog converter (DAC) using the dynamic element matching provided by the present invention. More specifically, FIG. 3(e) shows the signal.

$$e[n]=y[n]-\alpha x[n]-\beta,$$

where $$\alpha = 1 + \frac{1}{N}\sum_{i=0}^{N-1}(e_{h_i} - e_{l_i}) \text{ and}$$

-continued $$\beta = \sum_{i=0}^{N-1} e_{l_i}$$

Figure 3F:
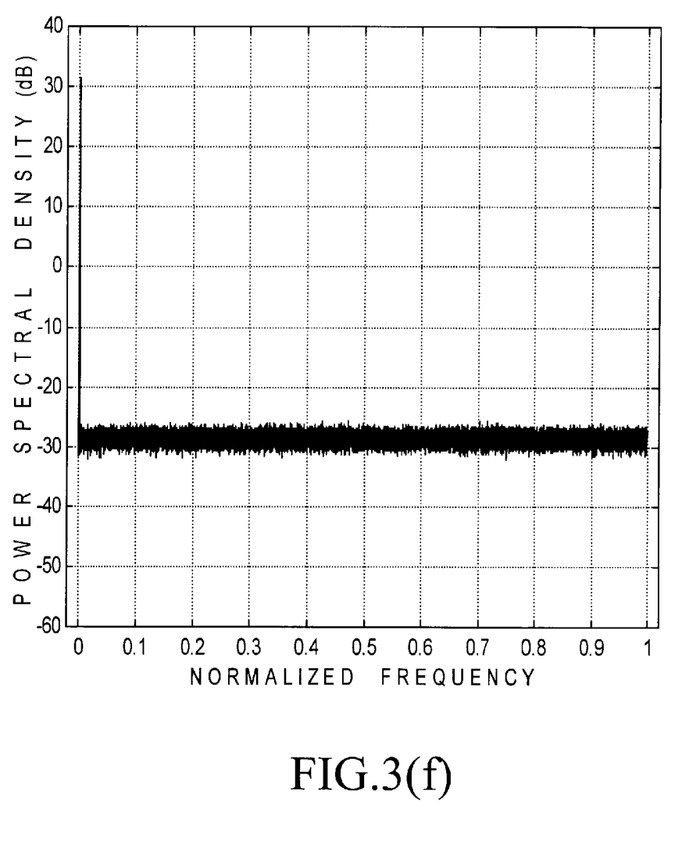
FIG. 3(f) demonstrates the noise of the digital-to-analog converter using the dynamic element matching provided by the present invention.

FIG. 3(f) demonstrates the noise of the digital-to-analog converter using the dynamic element matching provided by the present invention.

In these simulations, the static mismatch errors were chosen within +/−5% of the nominal LSB value of the DAC. Rather severe harmonic distortion results from the static mismatch errors in the absence of DEM, as evidenced by the numerous spurs distributed across the spectrum of FIGS. 3(b) and 3(c), resulting in a SFDR of less than 40 dB. This harmonic distortion is largely eliminated by the present invention, as evidenced by the data of FIGS. 3(d), 3(e), and 3(f). With regard to the simulation of FIG. 3, the PSDs were each estimated by averaging 32 length $2^{17}$ periodograms. The input was generated by adding dither to a high-resolution sinusoid, and quantizing to a 3-bit value. The dither was a white noise sequence with a triangular probability density function supported on (−1, 1), so that the quantization error was modeled as white noise. It is important to note that the white noise of the DAC does not depend on the statistical properties of the input, and that a dithered sinusoid was used as a non-limiting example only.

What is claimed is:

1. A randomized dynamic element matching digital-to-analog converter for converting an N-level digital input signal to an analog output signal corresponding thereto during at least one conversion cycle, including:
    a. a stochastic barrel shifting encoder including an input and N−1 outputs, the input of the stochastic barrel shifting encoder operative to receive the N-level digital signal, and each of the plurality of outputs of the stochastic barrel shifting encoder having a one of a series of unique output addresses;
    b. a plurality of N−1 digital-to-analog converter elements each including an input and an output, with each of the inputs of the digital-to-analog converter elements connected to one N−1 of outputs of the stochastic barrel shifting encoder;
    c. a random number generator operative to generate a random number offset o[n], and connected to provide the random number offset o[n] to the stochastic barrel shifting encoder to be used to determine the first of the plurality of N−1 digital-to-analog converter elements to be used during a particular conversion cycle; and
    d. an analog output summing node connected to the outputs of the plurality of N−1 digital-to-analog converter elements in order to receive and sum the analog outputs of the digital-to-analog converter elements to generate an aggregated analog output.

2. A randomized dynamic element matching digital-to-analog converter for converting an N-level digital input signal to an analog output signal corresponding thereto during at least one conversion cycle, as set forth in claim 1, wherein the input signal is a binary signal, and wherein the digital-to-analog converter elements are unit-digital-to-analog converter elements.

3. A randomized dynamic element matching digital-to-analog converter for converting an N-level digital input signal to an analog output signal corresponding thereto during at least one conversion cycle, as set forth in claim 2, wherein the stochastic barrel shifting encoder is an all-digital encoder.

4. A randomized dynamic element matching digital-to-analog converter for converting an N-level digital input signal to an analog output signal corresponding thereto during at least one conversion cycle, as set forth in claim 1, wherein the random number generator is included within the stochastic barrel shifting encoder.

5. A randomized dynamic element matching digital-to-analog converter for converting an N-level digital input signal to an analog output signal corresponding thereto during at least one conversion cycle, as set forth in claim 1, wherein the random number offset o[n] is an integer used directly in to select the digital-to-analog converter elements (DACE) according to, $$DACE_{o[n]}, DACE_{(o[n]+1)\%(N-1)}, \ldots, DACE_{(o[n]+x[n]-1)\%(N-1)},$$

where the random number offset o[n] is an integer randomly selected from the set including number-members i, {0, 1, . . . , N−2}, and % denotes the "modulo" operator.

6. A randomized dynamic element matching digital-to-analog converter for converting an N-level digital input signal to an analog output signal corresponding thereto during at least one conversion cycle, as set forth in claim 5, wherein the possibility of selection of each of the number-members i of the set {0, 1, . . . , N−2} to provide the random number offset o[n] is equi-probable as denoted by, $$P\{o[n] = i\} = \frac{1}{N-1},$$

for all of the number-members i, and the value of o[n] is roughly statistically independent of previously generated values.

7. A randomized dynamic element matching digital-to-analog converter for converting an N-level digital input signal to an analog output signal corresponding thereto during at least one conversion cycle, as set forth in claim 6, wherein the stochastic barrel shifting encoder maps the N-level binary digital input to the N−1 outputs such that:

$$\sum_{i=0}^{N-2} x_i[n] = x[n],$$

where the binary digital input, x[n] is a sequence of unsigned integers such that x[n]<N.

8. A method for randomized dynamic element matching digital-to-analog conversion for converting an N-level digital input signal to an analog output signal corresponding thereto during at least one conversion cycle, including the steps of:
    a. receiving an N-level digital input signal in a stochastic barrel shifting encoder including an input and a series of N−1 outputs, with each of the series of N−1 outputs having a unique output address {0, 1, . . . , N−2};
    b. mapping the N-level digital input signal onto a plurality of N−1 output units;
    c. providing each of the plurality of N−1 output units to a digital-to-analog converter element, via each of the N−1 outputs of the stochastic barrel shifting encoder, to convert each of the plurality of N−1 output units into an analog signal;
    d. generating a random number offset o[n];
    e. using the random number offset o[n] to select the first digital-to-analog converter element to be used during a particular conversion cycle; and f. summing the analog signals from the N−1 output units to generate an aggregated analog output, whereby an N-level digital input signal is mapped onto a series of N−1 output units and provided to a series of N−1 digital-to-analog converters in a manner such that the address of the first of the series of N−1 digital-to-analog converter elements is randomly determined during each conversion cycle in order to eliminate harmonic noise.

9. A method for randomized dynamic element matching digital-to-analog conversion for converting an N-level digital input signal to an analog output signal corresponding thereto during at least one conversion cycle, as set forth in claim 8, wherein the N-level digital input signal is a binary signal, and the digital-to-analog converter elements are unit-digital-to-analog converter elements.

10. A method for randomized dynamic element matching digital-to-analog converter for converting an N-level digital input signal to an analog output signal corresponding thereto during at least one conversion cycle, as set forth in claim 9, wherein the stochastic barrel shifting encoder is an all-digital encoder.

11. A method for randomized dynamic element matching digital-to-analog conversion for converting an N-level digital input signal to an analog output signal corresponding thereto during at least one conversion cycle, as set forth in claim 8, wherein the random number offset o[n] generated in step (d) is an integer used directly in the selection of the digital-to-analog converter element according to, $$DACE_{o[n]}, DACE_{(o[n]+1)\%(N-1)}, \ldots, DACE_{(o[n]+x[n]-1)\%(N-1)},$$

where the random number offset o[n] is an integer randomly selected from the set including number-members i, {0, 1, . . . , N−2}, and % denotes the "modulo" operator.

12. A method for randomized dynamic element matching digital-to-analog conversion for converting an N-level digital input signal to an analog output signal corresponding thereto during at least one conversion cycle, as set forth in claim 10, wherein the possibility of selection of each of the number-members i of the set {0, 1, . . . , N−2} to provide the random number offset o[n] is equi-probable as denoted by, $$P\{o[n] = i\} = \frac{1}{N-1},$$

for all of the number-members i, and the value of o[n] is roughly statistically independent of previously generated values.

13. A randomized dynamic element matching digital-to-analog converter for converting an N-level digital input signal to an analog output signal corresponding thereto during at least one conversion cycle, as set forth in claim 12, wherein stochastic barrel shifting encoder maps the N-level binary digital input to the N−1 outputs such that:

$$\sum_{i=0}^{N-2} x_i[n] = x[n],$$

where the binary digital input, x[n] is a sequence of unsigned integers such that x[n]<N.

* * * * *

UNITED STATES PATENT AND TRADEMARK OFFICE
CERTIFICATE OF CORRECTION

| | | |
|---|---|---|
| PATENT NO. | : 6,466,147 B1 | |
| DATED | : October 15, 2002 | |
| INVENTOR(S) | : Henrik T. Jensen and Joseph T. Jensen | |

It is certified that error appears in the above-identified patent and that said Letters Patent is hereby corrected as shown below:

<u>Column 8,</u>
Line 5, for the claim reference numeral "10", should read -- 11 --.

Signed and Sealed this

Fifth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.       : 6,466,147 B1　　　　　　　　　　　　　　　　　　　　Page 1 of 1
APPLICATION NO.  : 09/427195
DATED            : October 15, 2002
INVENTOR(S)      : Henrik T. Jensen and Joseph T. Jensen It is certified that error appears in the above-identified patent and that said Letters Patent is hereby corrected as shown below:

Column 8, line 5, for the claim reference numeral "10", should read --11--.

Signed and Sealed this

Twenty-second Day of January, 2008

JON W. DUDAS
*Director of the United States Patent and Trademark Office*